United States Patent
Arakawa et al.

(10) Patent No.: US 8,344,456 B2
(45) Date of Patent: Jan. 1, 2013

(54) ELECTROSTATIC DISCHARGE PROTECTION CIRCUIT AND INTEGRATED CIRCUIT DEVICE INCLUDING ELECTROSTATIC DISCHARGE PROTECTION CIRCUIT

(75) Inventors: Masahito Arakawa, Shinjuku (JP); Toshihiko Mori, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 228 days.

(21) Appl. No.: 12/606,438

(22) Filed: Oct. 27, 2009

(65) Prior Publication Data
US 2010/0102392 A1 Apr. 29, 2010

(30) Foreign Application Priority Data
Oct. 28, 2008 (JP) ................. 2008-277118

(51) Int. Cl.
*H01L 23/60* (2006.01)
(52) U.S. Cl. .......... 257/355; 257/358; 361/54; 361/100; 327/389; 327/525
(58) Field of Classification Search .......... 257/355
See application file for complete search history.

(56) References Cited

U.S. PATENT DOCUMENTS

| | | | | |
|---|---|---|---|---|
| 6,803,632 B2 * | 10/2004 | Kato | ............. | 257/357 |
| 7,307,822 B2 * | 12/2007 | Kitagawa et al. | ............. | 361/91.1 |
| 7,495,872 B2 * | 2/2009 | Irino | ............. | 361/54 |
| 7,869,174 B2 * | 1/2011 | Tanaka et al. | ............. | 361/56 |
| 2001/0023962 A1* | 9/2001 | Pasqualini | ............. | 257/355 |
| 2004/0135206 A1* | 7/2004 | Kato | ............. | 257/355 |
| 2006/0114047 A1 | 6/2006 | Irino | | |
| 2007/0182444 A1 | 8/2007 | Tanaka et al. | | |

FOREIGN PATENT DOCUMENTS

| | | |
|---|---|---|
| JP | 2006-156563 A | 6/2006 |
| JP | 2007-200987 A | 8/2007 |

* cited by examiner

*Primary Examiner* — Calvin Lee
*Assistant Examiner* — Abul Kalam
(74) *Attorney, Agent, or Firm* — Fujitsu Patent Center

(57) ABSTRACT

An ESD protection circuit including a first electrostatic discharge protection circuit provided between first power supply wiring and first ground wiring; a second ESD protection circuit provided between second power supply wiring and second ground wiring; a third ESD protection circuit provided between the first ground wiring and the second ground wiring; a PMOS transistor coupled to the first power supply wiring and provided between a first CMOS circuit coupled to the first ground wiring and the first power supply wiring, the first CMOS circuit receiving a signal from a first internal circuit and outputting a signal to a first node; an NMOS transistor provided between the first node and the first ground wiring; and an ESD detection circuit that renders the PMOS transistor conductive and the NMOS transistor non-conductive during normal operation, and renders the PMOS transistor non-conductive and the NMOS transistor conductive when an ESD is applied.

8 Claims, 6 Drawing Sheets

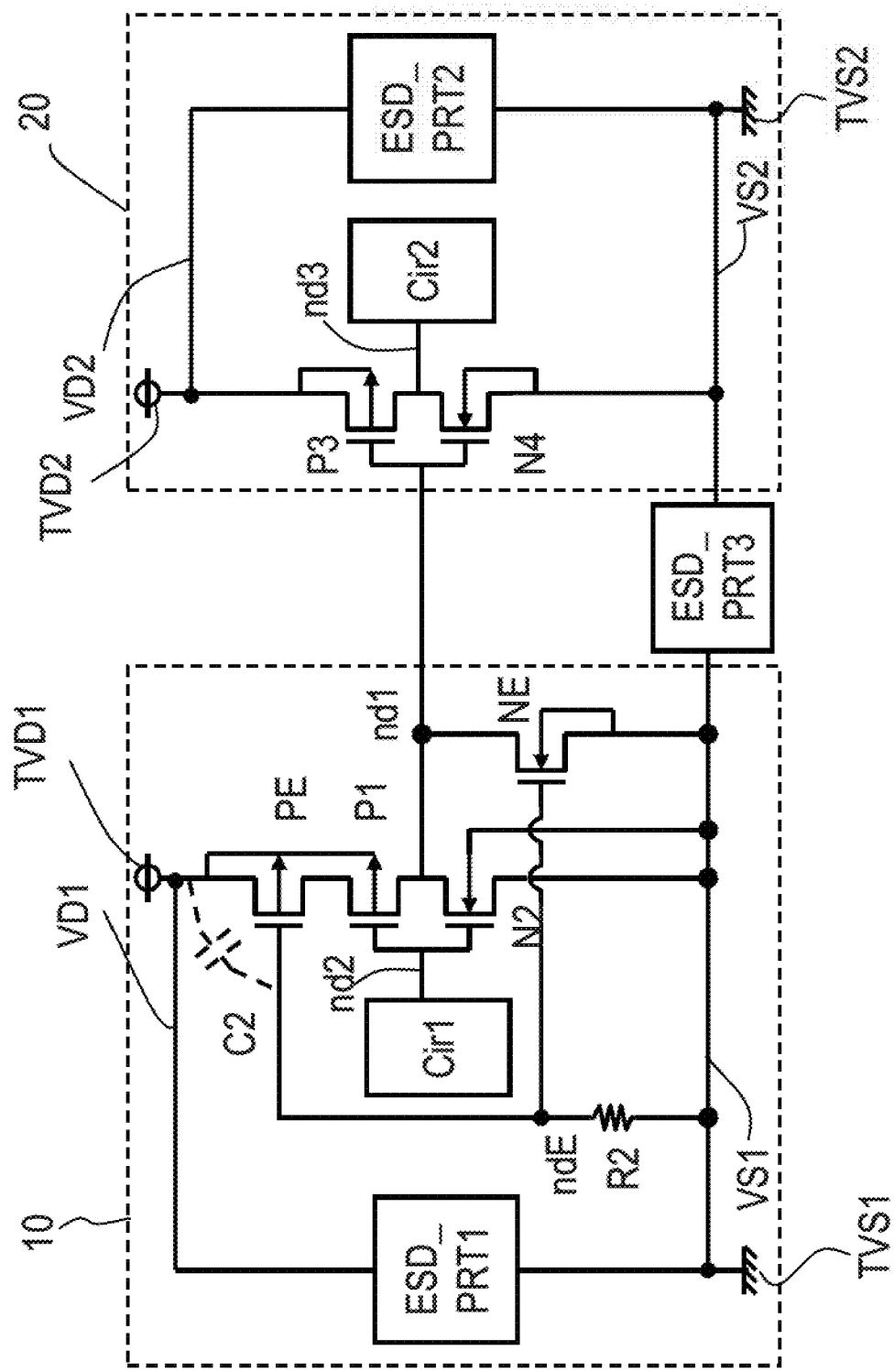

ELECTROSTATIC DISCHARGE PROTECTION CIRCUIT AND INTEGRATED CIRCUIT DEVICE INCLUDING ELECTROSTATIC DISCHARGE PROTECTION CIRCUIT

CROSS-REFERENCE TO RELATED APPLICATION

This application is based upon and claims the benefit of priority of the prior Japanese Patent Application No. 2008-277118, filed on Oct. 28, 2008, the entire contents of which are incorporated herein by reference.

FIELD

The embodiments discussed herein are related to an electrostatic discharge (ESD) protection circuit and an integrated circuit device including the ESD protection circuit.

BACKGROUND

A typical large-scale integrated circuit (LSI) device that has recently been developed includes two or more power supply areas in a semiconductor chip and includes a circuit block in each of the power supply areas. For example, the semiconductor chip is provided with an analog circuit block that receives and processes an analog input from outside, a digital circuit block that receives and processes a digital output of the analog circuit block, and another analog circuit block that receives and processes a digital output of the digital circuit block and generates an analog output.

Such division into two or more power supply areas is performed for the reasons of that (1) the influence of noise may be reduced due to separating power supply wiring and ground wiring of the digital circuit block, in which noise affecting the power supply occurs frequently, and power supply wiring and ground wiring of the analog circuit block, in which the occurrence of noise is undesired, from each other; and that (2) power consumption of the chip may be reduced due to controlling turning on and off the power supply in each of the power supply areas.

Conventionally, an electrostatic discharge (ESD) protection circuit has been provided to prevent an internal circuit element, such as a transistor, from suffering damage resulting from an ESD applied from an external terminal. The ESD protection circuit is needed also in a semiconductor device including two or more power supply areas as described above.

A semiconductor device including two or more power supply areas is provided with an inter-circuit-block interface circuit between the power supply areas. In the interface circuit, a protection circuit against the ESD applied between different power supplies desirably includes a function different from a function of an ESD protection circuit of a conventional semiconductor device with a single power system.

The ESD protection circuit of the interface circuit provided between the power supply areas is discussed in, for example, Japanese Patent Application Laid-Open Publication No. 2006-156563 or Japanese Patent Application Laid-Open Publication No. 2007-200987. FIG. 6 of Japanese Patent Application Laid-Open Publication No. 2006-156563 illustrates a P-channel metal oxide semiconductor (PMOS) protection transistor provided between a complementary metal oxide semiconductor (CMOS) inverter on the side of an output circuit block of the interface circuit and a power supply, and an N-channel metal oxide semiconductor (NMOS) protection transistor provided between an output of the CMOS inverter and a ground power supply, and shows that the PMOS protection transistor is turned off based on a control signal from inside of an input circuit block when an ESD is applied. FIG. 24 of Japanese Patent Application Laid-Open Publication No. 2007-200987 illustrates a circuit for controlling a gate signal of a CMOS inverter on the side of an output circuit block to be held at a given level when an ESD is applied, and that when the ESD is applied, a PMOS transistor of the CMOS inverter is turned off and an NMOS transistor of the CMOS inverter is turned on.

However, when the ESD protection circuit discussed in Japanese Patent Application Laid-Open Publication No. 2006-156563 is used, such control signals need to be generated to correspond to the different power supply areas, and when the ESD protection circuit is used in an LSI device in which each circuit block is processed as different intellectual property (circuit data), a circuit designing process for the ESD protection circuit needs to be performed after an arrangement process of the circuit blocks. As a result, versatility is reduced. For example, the ESD protection circuit is desirably provided in a circuit block in each power supply area.

When the ESD protection circuit discussed in Japanese Patent Application Laid-Open Publication No. 2007-200987 is used, a circuit for the ESD protection needs to be provided for the gate terminal of the final-stage CMOS inverter on the side of the output circuit block and an output operation may be adversely affected during normal operation.

SUMMARY

According to an aspect of the embodiments, an electrostatic discharge protection circuit includes a first electrostatic discharge protection circuit provided between first power supply wiring and first ground wiring; a second electrostatic discharge protection circuit provided between second power supply wiring and second ground wiring; a third electrostatic discharge protection circuit provided between the first ground wiring and the second ground wiring; a PMOS transistor coupled to the first power supply wiring and provided between a first CMOS circuit coupled to the first ground wiring and the first power supply wiring, the first CMOS circuit receiving a signal from a first internal circuit and outputting a signal to a first node; an NMOS transistor provided between the first node and the first ground wiring; and an electrostatic discharge detection circuit that renders the PMOS transistor conductive and the NMOS transistor non-conductive during normal operation, and renders the PMOS transistor non-conductive and the NMOS transistor conductive when an electrostatic discharge is applied.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a circuit diagram of an LSI device including an ESD protection circuit according to a third embodiment;

DESCRIPTION OF EMBODIMENTS

Embodiments are described below with reference to the accompanying drawings. The technical scope of the present invention is not limited by the description of the embodiments and encompasses the recitation of the claims appended hereto and the equivalence of the claims.

Figure 1A:
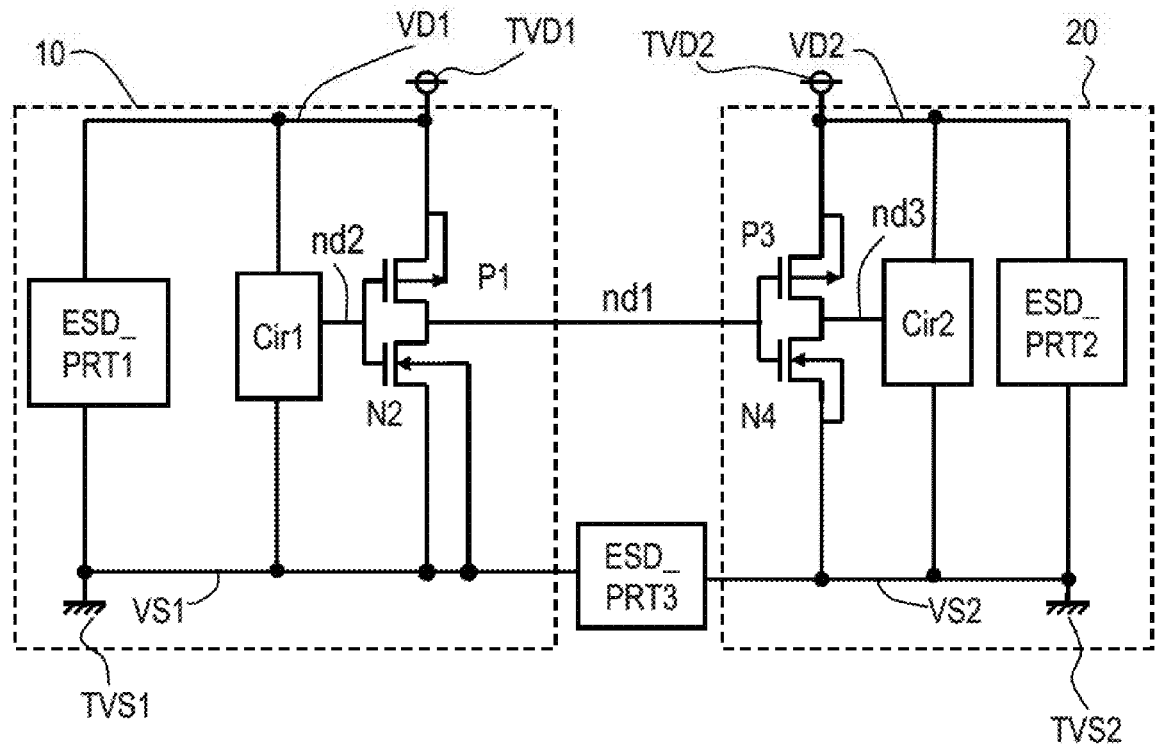
FIG. 1A is a circuit diagram of a large-scale integrated circuit (LSI) device including an electrostatic discharge (ESD) protection circuit according to a first embodiment.

FIG. 1A is a circuit diagram of a large-scale integrated circuit (LSI) device including an electrostatic discharge (ESD) protection circuit according to a first embodiment. For example, the LSI device is divided into a first power supply area 10 and a second power supply area 20.

The first power supply area 10 includes first power supply wiring VD1, first ground wiring VS1, and a first circuit block including a first internal circuit Cir1 and a first complementary metal oxide semiconductor (CMOS) circuit P1N2 that are coupled to the first power supply wiring VD1 and the first ground wiring VS1. The first CMOS circuit P1N2 is an inverter circuit formed by, for example, a PMOS transistor P1 and an NMOS transistor N2, and receives a signal from a node nd2 of the first internal circuit Cir1 as an input, and outputs a signal to a node nd1.

The second power supply area 20 includes second power supply wiring VD2, second ground wiring VS2, and a second circuit block including a second internal circuit Cir2 and a second CMOS circuit P3N4 that are coupled to the second power supply wiring VD2 and the second ground wiring VS2. The second CMOS circuit P3N4 is an inverter circuit formed by, for example, a PMOS transistor P3 and an NMOS transistor N4, and receives an output signal from the node nd1 of the first circuit block as an input, and outputs a signal to a node nd3 of the second internal circuit Cir2.

The first CMOS circuit P1N2, the second CMOS circuit P3N4, and wiring of the node nd1 form an interface circuit between the first circuit block and the second circuit block.

The first power supply wiring VD1 in the first power supply area 10 is supplied with an external power supply voltage through a first power supply terminal TVD1. The first ground wiring VS1 is coupled to external ground wiring through a first ground terminal TVS1. Similarly, the second power supply wiring VD2 in the second power supply area 20 is supplied with an external power supply voltage through a second power supply terminal TVD2. The second ground wiring VS2 is coupled to external ground wiring through a second ground terminal TVS2. The first power supply wiring VD1 in the first power supply areas 10 and the second power supply wiring VD2 in the second power supply area 20 are separated from each other. The first power supply wiring VD1 is supplied with the external power supply through the first power supply terminal TVD1. The second power supply wiring VD2 is supplied with the external power supply through the second power supply terminal TVD2. The first ground wiring VS1 is coupled to the external ground wiring through the first ground terminal TVS1. The second ground wiring VS2 is coupled to the external ground wiring through the second ground terminal TVS2. Due to the configuration, the influence of power supply noise that may occur between the first circuit block in the first power supply area 10 and the second circuit block in the second power supply area 20 may be reduced.

The first power supply area 10 is provided with an ESD protection circuit ESD_PRT1 that becomes conductive and forms a current path for static electricity when the ESD is applied between the power supply wiring VD1 and the ground wiring VS1. Similarly, the second power supply area 20 is provided with an ESD protection circuit ESD_PRT2 that becomes conductive and forms a current path for static electricity when the ESD is applied between the power supply wiring VD2 and the ground wiring VS2. The ESD protection circuits ESD_PRT1 and ESD_PRT2 remain non-conductive during normal operation and become conductive when the ESD is applied.

Figure 1B:
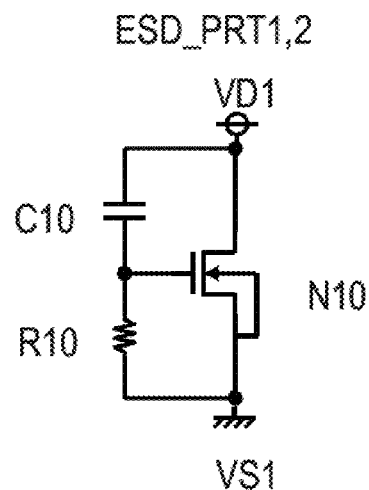
FIG. 1B is a circuit diagram of an example of the ESD protection circuit in FIG. 1A.

As illustrated in FIG. 1B, each of the ESD protection circuits ESD_PRT1 and ESD_PRT2 includes an NMOS transistor N10, a capacitor C10, and a resistor R10. When the ESD is applied between the power supply wiring VD1 and the ground wiring VS1, a gate potential of the NMOS transistor N10 temporarily increases and the NMOS transistor N10 becomes conductive, and the current path for the static electricity is formed through the NMOS transistor N10.

Figure 1C:
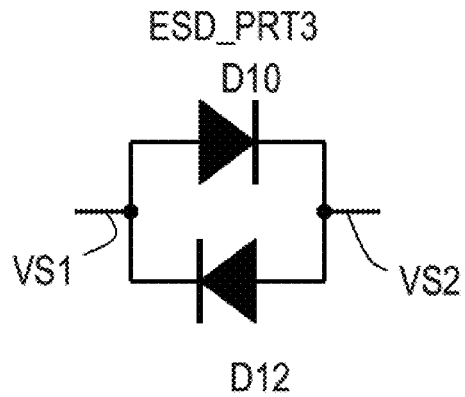
FIG. 1C is a circuit diagram of another example of the ESD protection circuit in FIG. 1A.

An ESD protection circuit ESD_PRT3 is provided between the first ground wiring VS1 and the second ground wiring VS2. As illustrated in FIG. 1C, the ESD protection circuit ESD_PRT3 includes diodes D10 and D12 that are provided in opposite directions between the ground wiring VS1 and the ground wiring VS2, for example. A voltage as small as noise that occurs in the ground wiring VS1 and the ground wiring VS2 due to operations of the internal circuits Cir1 and Cir2 does not exceed a voltage obtained in the forward direction of the diodes D10 and D12, and the diodes remain non-conductive. Therefore, noise that occurs at one of the ground wirings VS1 or VS2 may not reach the other ground wiring. In turn, when a voltage larger than the voltage obtained in the forward direction of the diodes D10 and D12 occurs between the ground wiring VS1 and the ground wiring VS2 due to application of the ESD, the diodes D10 and D12 become conductive and the current path for the static electricity is formed through the diodes D10 and D12.

As further illustrated in FIG. 1A, in the LSI device including the power supply areas 10 and 20, which are different from each other, application of the ESD from the external terminals is possible during an assembly process and/or an implementation process of the LSI device. Therefore, the ESD protection circuits are desirably provided in the LSI device. In a test for the ESD protection, two terminals are selected from, for example, the power supply terminals TVD1 and TVD2, and the ground terminals TVS1 and TVS2, and one of the selected terminals is grounded, and the ESD is applied to the other terminal. The ESD protection circuit desirably forms the current path for the static electricity when the ESD is applied, and prevents the circuit elements in the internal circuits Cir1 and Cir2, and the transistors P1, N2, P3, and N4 of the CMOS circuits from suffering damage.

Charges caused by the ESD applied between the power supply wiring VD1 and the power supply wiring VD2, and between the ground wiring VS1 and the ground wiring VS2 flow out to the ground terminals TVS1 and TVS2 through the current paths formed by the first and second ESD protection circuits ESD_PRT1 and ESD_PRT2.

The LSI device including the power supply areas 10 and 20, which are different from each other, desirably employs a configuration of the protection circuit applicable when an ESD is applied between the first power supply wiring VD1 and the second ground wiring VS2. In such a case, the first ESD protection circuit ESD_PRT1 and the third ESD protection circuit ESD_PRT3 mutually conduct and a current path is formed in the route of the first power supply wiring VD1, the first ESD protection circuit ESD_PRT1, the ground wiring VS1, the third ESD protection circuit ESD_PRT3, and the ground wiring VS2. Concurrently, due to the formation of the current path, the sum of the voltages occurring in the ESD protection circuits ESD_PRT1 and ESD_PRT3 is applied to the CMOS circuit P1N2, the node nd1, and the CMOS circuit P3N4 that form the interface circuit.

Under circumstances where the ESD is applied, the power supply wiring VD1 and the power supply wiring VD2 are supplied with no power supply voltage from outside. Thus, the electric potential of the node nd2 of the first internal circuit Cir1 (the node nd2 of the CMOS circuit P1N2) may be at the "H" level or the "L" level, that is, the potential level of the node nd2 is unstable. Therefore, to protect, for example, the transistors from the ESD, every potential level including the potential level of the worst case is desirably considered.

(1) When the electric potential of the node nd2 of the CMOS circuit P1N2 is at the "H" level, the PMOS transistor P1 is non-conductive. Due to the formation of the current path, the sum of the voltages occurring in the two ESD protection circuits is distributed to be applied to the PMOS transistor P1 and between the gate and source of the NMOS transistor N4. In turn, (2) when the electric potential of the node nd2 of the CMOS circuit P1N2 is at the "L" level, the PMOS transistor P1 is conductive. Due to the formation of the current path, the sum of the voltages occurring in the two ESD protection circuits is applied concentratedly between the gate and source of the NMOS transistor N4. Thus, (2) is the worst case.

Accordingly, the circuits are desirably protected from the ESD even in the case of (2).

Figure 2:
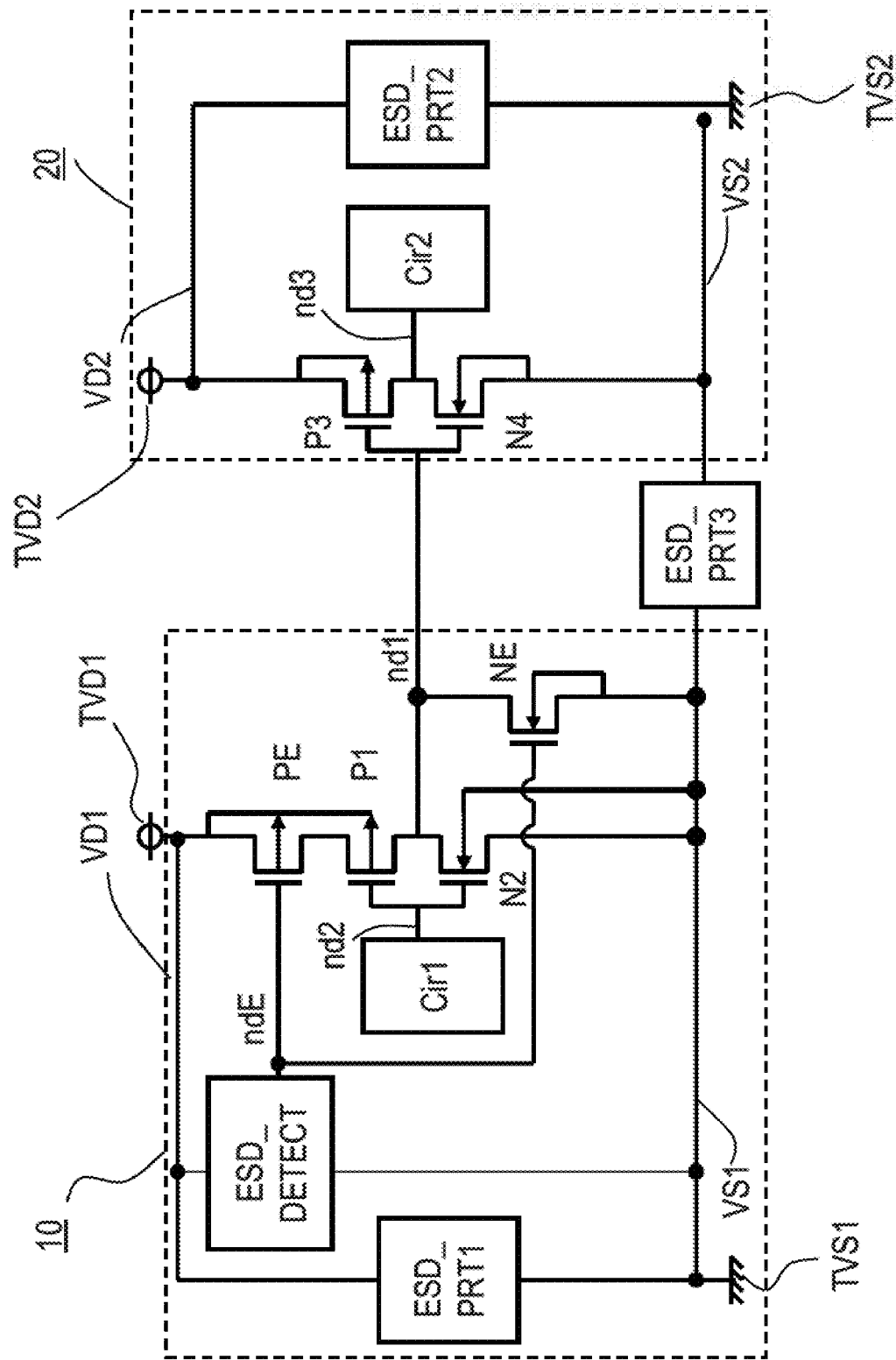
FIG. 2 is a circuit diagram of an LSI device including an ESD protection circuit according to a second embodiment.

FIG. 2 is a circuit diagram of an LSI device including an ESD protection circuit according to a second embodiment. Similar to the LSI device in FIG. 1, the LSI device in FIG. 2 is divided into, for example, a first power supply area 10 and a second power supply area 20. Power supply wiring VD1 and power supply wiring VD2 are supplied power supply voltages from a first power supply terminal TVD1 and a second power supply terminal TVD2, respectively. First ground wiring VS1 and second ground wiring VS2 are coupled to external ground wiring through a first ground terminal TVS1 and a second ground terminal TVS2, respectively. A first internal circuit block is provided with a first internal circuit Cir1, a first CMOS circuit P1N2, and a first ESD protection circuit ESD_PRT1. A second internal circuit block is provided with a second internal circuit Cir2, a second CMOS circuit P3N4, and a second ESD protection circuit ESD_PRT2. A third ESD protection circuit ESD_PRT3 is provided between the ground wiring VS1 and the ground wiring VS2.

The ESD protection circuit in FIG. 2 includes, in the first power supply area 10, a PMOS protection transistor PE provided between a PMOS transistor P1 of the first CMOS circuit P1N2 and the first power supply wiring VD1, an NMOS protection transistor NE provided between a node nd1 and the first ground wiring VS1, and an ESD detection circuit ESD_DETECT that renders the PMOS protection transistor PE conductive and the NMOS protection transistor NE non-conductive during normal operation, and renders the PMOS protection transistor PE non-conductive and the NMOS protection transistor NE conductive when the ESD is applied.

Figure 3A:
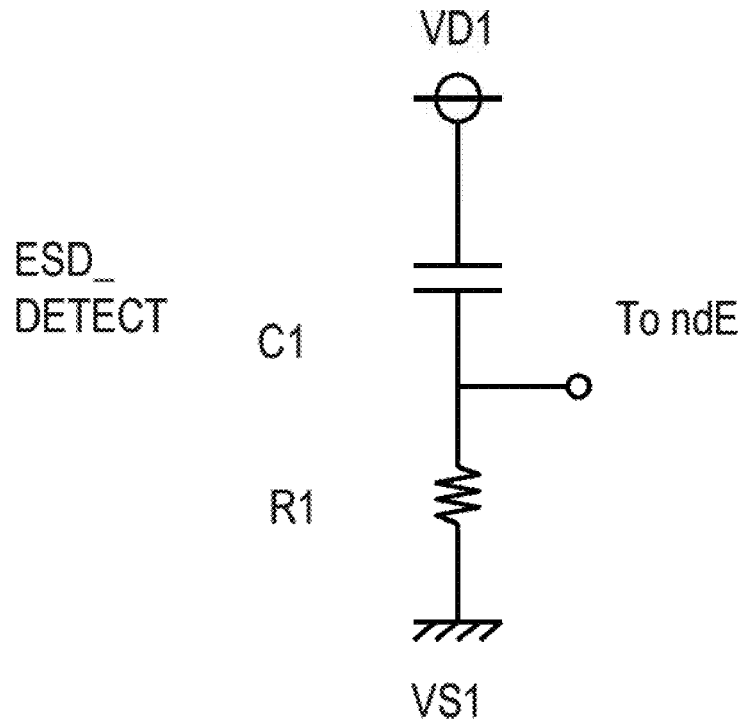
FIG. 3A is a circuit diagram of an example of the ESD detection circuit in FIG. 2.
Figure 3B:
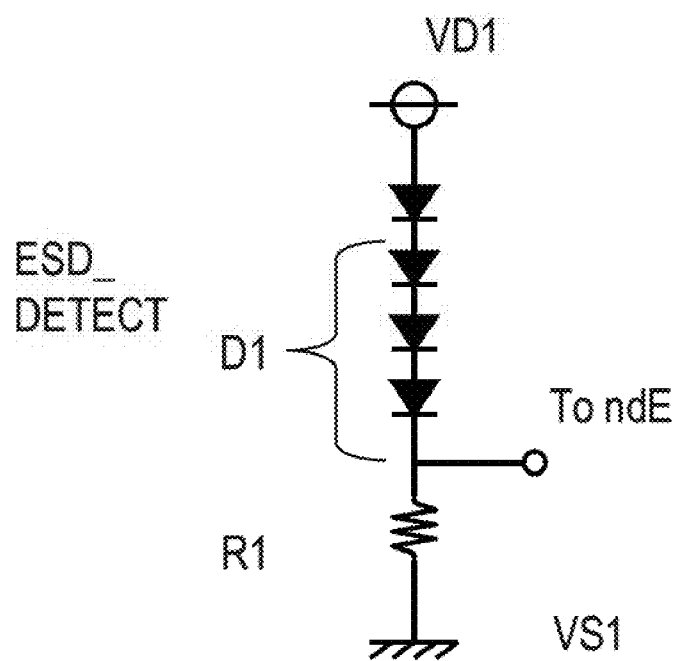
FIG. 3B is a circuit diagram of another example of the ESD detection circuit in FIG. 2.

FIG. 3A is a circuit diagram of an example of the ESD detection circuit ESD_DETECT in FIG. 2. FIG. 3B is a circuit diagram of another example of the ESD detection circuit ESD_DETECT in FIG. 2. In the ESD detection circuit in FIG. 3A, a capacitor C1 and a resistor R1 are coupled in series between the first power supply wiring VD1 and the first ground wiring VS1, and the coupling point of the capacitor C1 and the resistor R1 is coupled to a node ndE. In the ESD detection circuit in FIG. 3A, as soon as the ESD is applied and a high voltage is applied between the first power supply wiring VD1 and the first ground wiring VS1, the electric potential of the node ndE of the coupling point becomes the "H" level due to the capacitance coupling using the capacitor C1. During normal operation, no ESD is applied and the electric potential of the node ndE is maintained at the "L" level.

In the ESD detection circuit in FIG. 3B, a diode group D1 with two or more stages and the resistor R1 are coupled in series between the first power supply wiring VD1 and the first ground wiring VS1, and the coupling point of the diode group D1 and the resistor R1 is coupled to the node ndE. Also in the ESD detection circuit in FIG. 3B, as soon as the ESD is applied and a high voltage is applied between the first power supply wiring VD1 and the first ground wiring VS1, the diode group D1 becomes conductive and the electric potential of the node ndE of the coupling point becomes the "H" level. During normal operation, no ESD is applied and the electric potential of the node ndE is maintained at the "L" level.

Referring again to FIG. 2, operations of the ESD protection circuit are described. When the ESD is applied between the first power supply terminal TVD1 and the second ground terminal TVS2, the electric potential of the node ndE of the ESD detection circuit ESD_DETECT temporarily becomes "H" level. As a result, the PMOS protection transistor PE becomes non-conductive and the NMOS protection circuit NE becomes conductive, and the electric potential of the node nd1 becomes the "L" level regardless of whether the electric potential of the node nd2 of the first internal circuit Cir1 is at the "H" level or the "L" level.

When an ESD is applied, the first ESD protection circuit ESD_PRT1 and the third ESD protection circuit ESD_PRT3 mutually conduct, and a current path for discharging the charge caused by the ESD is formed in the route of the first power supply wiring VD1, the first ESD protection circuit ESD_PRT1, the first ground wiring VS1, the third ESD protection circuit ESD_PRT3, and the second ground wiring VS2.

As described above, since the electric potential of the node nd1 becomes the "L" level, the voltage applied to the first ESD protection circuit ESD_PRT1 is applied between the source and drain of the PMOS protection transistor PE. Since the electric potential of the node nd1 is at the "L" level, the voltage applied to the third ESD protection circuit ESD_PRT3 is applied between the gate and channel (a ground substrate) of an NMOS transistor N4 of the CMOS circuit P3N4 in the second power supply area 20. That is, a high voltage applied to the first ESD protection circuit ESD_PRT1 and the third ESD protection circuit ESD_PRT3 is distributed to be applied to the PMOS protection transistor PE and the NMOS transistor N4. Thus, the NMOS transistor N4 is protected from the application of the ESD.

Since the electric potential of the node ndE of the ESD detection circuit ESD_DETECT is maintained at the "L" level during normal operation, the PMOS protection transistor PE is maintained conductive and the NMOS protection transistor NE is maintained non-conductive, and an interface circuit may operate without hindrance.

In the ESD protection circuit in FIG. 2, the PMOS protection transistor PE and the NMOS protection transistor NE, and the PMOS transistor P1 and the NMOS transistor N2 of the first CMOS circuit P1N2 form an NOR circuit. The NOR circuit includes the node nd2 of the first internal circuit Cir1 and the node ndE of the ESD detection circuit ESD_DETECT as two inputs, and includes the node nd1 as an output. During normal operation, the electric potential of the node ndE is at the "L" level and a signal from the node nd2 of the first internal circuit Cir1 is inverted through the CMOS circuit P1N2 of the transistors P1 and N2 to be output to the node nd1. When the ESD is applied, the electric potential of the node ndE becomes the "H" level and the electric potential of the node nd1 is forced to become the "L" level.

FIG. 4 is a circuit diagram of an LSI device including an ESD protection circuit according to a third embodiment. Similar to the ESD protection circuit in FIG. 2, the ESD protection circuit in FIG. 4 includes a PMOS protection transistor PE and an NMOS protection transistor NE. The ESD detection circuit according to the third embodiment includes, for example, a parasitic capacitance C2 between the gate and source of the PMOS protection transistor PE, and a resistor R2. That is, the ESD detection circuit in FIG. 4 is configured substantially the same as the ESD detection circuit in FIG. 3A. Similar to the ESD detection circuit ESD_DETECT in FIG. 2, in the ESD detection circuit according to the third embodiment, which includes the parasitic capacitance C2 and the resistor R2, the electric potential of a node ndE is maintained at the "L" level during normal operation, and becomes the "H" level when an ESD is applied. The ESD protecting operations in the third embodiment are substantially the same as the ESD protecting operations in the second embodiment referring to FIG. 2.

Figure 5:
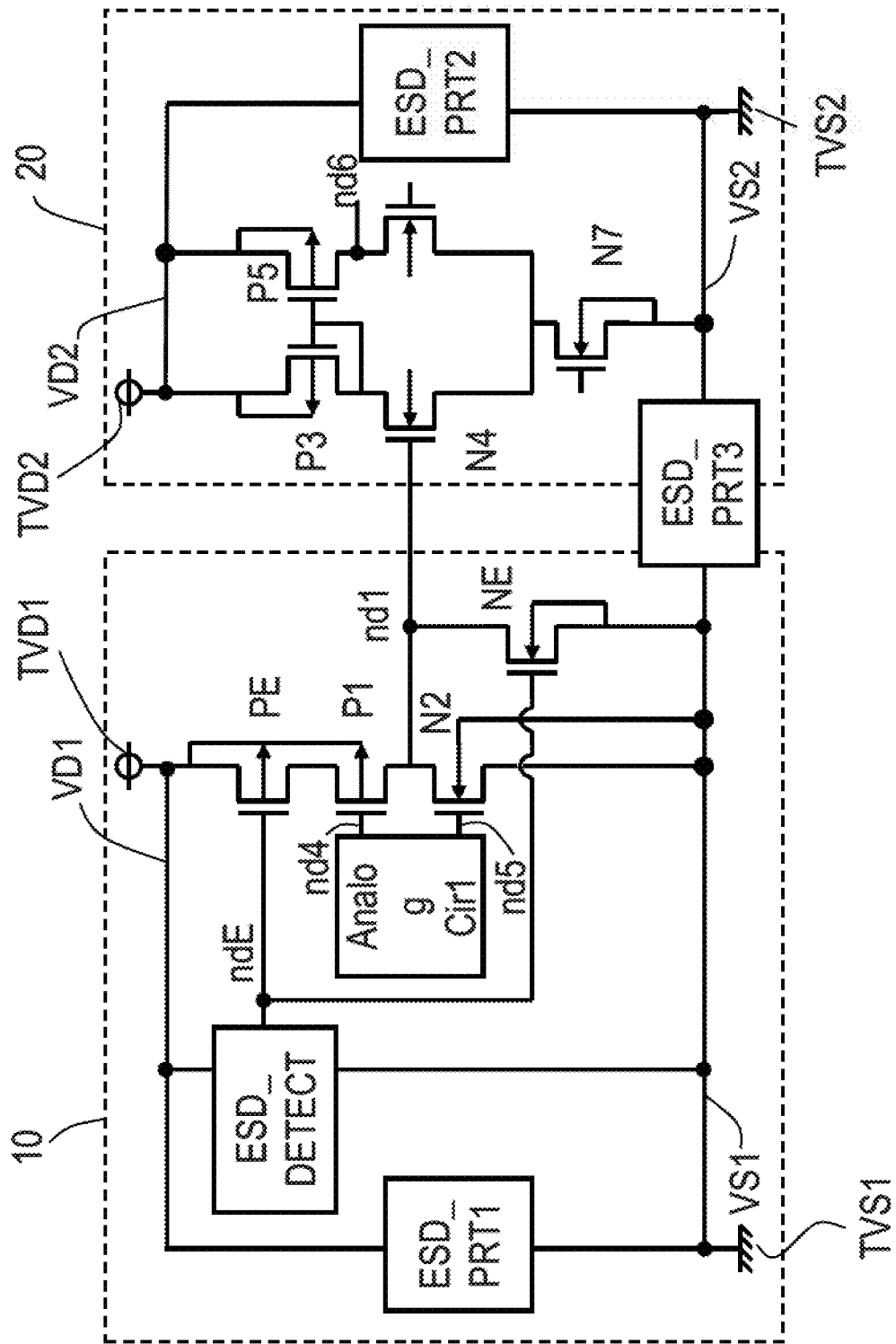
FIG. 5 is a circuit diagram of an LSI device including an ESD protection circuit according to a fourth embodiment.

FIG. 5 is a circuit diagram of an LSI device including an ESD protection circuit according to a fourth embodiment. The LSI device in FIG. 5 differs from the LSI device in FIG. 2 in that a first internal circuit Cir1 in a first power supply area 10 is an analog circuit that outputs an analog signal to a node nd4 or nd5 coupled to the gate of a PMOS transistor P1 or an NMOS transistor N2, respectively, and that a CMOS circuit in a second power supply area 20 is a differential input circuit, that is, an analog input circuit including a node nd6 coupled to a second internal circuit (not depicted). The analog input circuit in the second power supply area 20 may be, for example, an analog to digital converter instead of the differential input circuit.

The other elements in the ESD protection circuit in FIG. 5, such as a PMOS protection transistor PE, an NMOS protection transistor NE, and an ESD detection circuit ESD_DETECT, are substantially the same as those in the ESD protection circuit in FIG. 2. The differential input circuit in the second power supply area 20 includes, for example, PMOS transistors P3 and P5, NMOS transistors N4 and N6, and an NMOS transistor N7 that functions as a current source. The sources of the NMOS transistors N4 and N6 are coupled in common. A node nd1 in the first power supply area 10 is coupled to the gate of the NMOS transistor N4, and a reference voltage (not depicted) is applied to the gate of the NMOS transistor N6. Thus, in the LSI device in FIG. 5, an analog circuit is provided in each of the first power supply area 10 and the second power supply area 20. The ESD protection circuit according to the fourth embodiment may be used with an interface circuit between the analog circuits.

The ESD protection circuit in FIG. 5 operates similarly to the ESD protection circuit in FIG. 2. When an ESD is applied to a first power supply terminal TVD1 while a second ground terminal TVS2 is grounded, regardless of the potential levels of the nodes nd4 and nd5, the ESD detection circuit ESD_DETECT detects the application of the ESD and the electric potential of a node ndE becomes the "H" level, and the PMOS protection transistor PE becomes non-conductive and the NMOS protection transistor NE becomes conductive. As a result, a voltage applied to a first ESD protection circuit ESD_PRT1 is applied to the PMOS protection transistor PE, and a voltage applied to a third ESD protection circuit ESD_PRT3 is applied between the gate and channel of the NMOS transistor N4. Thus, damage to the NMOS transistor N4 may be reduced if not prevented.

Figure 6:
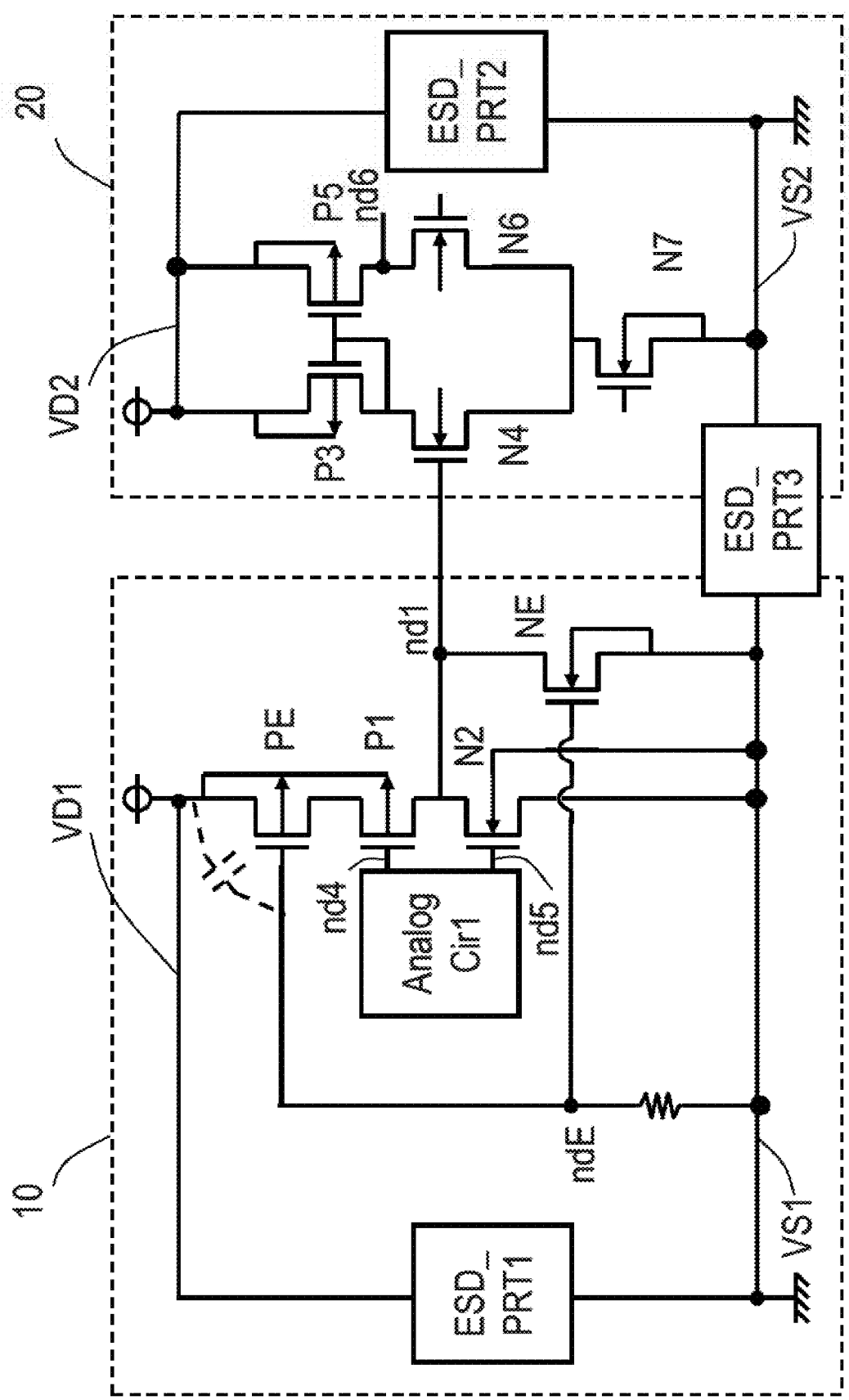
FIG. 6 is a circuit diagram of an LSI device including an ESD protection circuit according to a fifth embodiment.

FIG. 6 is a circuit diagram of an LSI device including an ESD protection circuit according to a fifth embodiment. Similar to the third ESD protection circuit ESD_PRT3 in FIG. 5, the ESD protection circuit in FIG. 6 includes a PMOS protection transistor PE and an NMOS protection transistor NE. An ESD detection circuit includes, for example, a parasitic capacitance C2 between the gate and source of the PMOS protection transistor PE, and a resistor R2. The ESD detection circuit is configured substantially the same as the ESD detection circuit in FIG. 3A. Similar to the ESD detection circuits in FIG. 2 and FIG. 5, in the ESD detection circuit that includes the parasitic capacitance C2 and the resistor R2 according to the fifth embodiment, the electric potential of a node ndE is maintained at the "L" level during normal operation, and the electric potential of the node ndE becomes the "H" level when an ESD is applied. The ESD protecting operations in the fifth embodiment are substantially the same as the ESD protecting operations in the second and fourth embodiments referring to FIGS. 2 and 5.

According to the embodiments described above, when an ESD is applied, the PMOS protection transistor becomes non-conductive and the NMOS protection transistor becomes conductive. As a result, a voltage stress applied to the transistors in the internal circuit along with the ESD may be distributed and damage to the MOS transistors in the first CMOS circuit may be reduced if not prevented.

In the ESD protection circuit according to the embodiments described above, the circuit elements in the interface circuit between the different power supply areas may be reduced if not prevented from suffering damage caused by the application of the ESD.

Although the embodiments of the present invention are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrostatic discharge protection circuit comprising:
   a first electrostatic discharge protection circuit provided between first power supply wiring and first ground wiring;
   a second electrostatic discharge protection circuit provided between second power supply wiring and second ground wiring;

a third electrostatic discharge protection circuit provided between the first ground wiring and the second ground wiring;

a PMOS transistor coupled to the first power supply wiring and provided between a first CMOS circuit coupled to the first ground wiring and the first power supply wiring, the first CMOS circuit receiving a signal from a first internal circuit and outputting a signal to a first node;

an NMOS transistor provided between the first node and the first ground wiring; and an electrostatic discharge detection circuit that renders the PMOS transistor conductive and the NMOS transistor non-conductive during normal operation, and renders the PMOS transistor non-conductive and the NMOS transistor conductive when an electrostatic discharge is applied;

wherein the electrostatic discharge detection circuit includes a capacitor and a resistor that are coupled in series between the first power supply wiring and the first ground wiring, and supplies each of the gates of the PMOS transistor and the NMOS transistor with a signal from a coupling node of the capacitor and the resistor.

2. An integrated circuit device comprising:

first and second power supply areas;

a first circuit block coupled to first power supply wiring and first ground wiring that are provided in the first power supply area, and including a first internal circuit and a first CMOS circuit that receives a signal from the first internal circuit and outputs a signal to a first node;

a second circuit block coupled to second power supply wiring and second ground wiring that are provided in the second power supply area, and including a second internal circuit and a second CMOS circuit that receives an output signal from the first node and outputs a signal to the second internal circuit;

a first electrostatic discharge protection circuit provided between the first power supply wiring and the first ground wiring;

a second electrostatic discharge protection circuit provided between the second power supply wiring and the second ground wiring;

a third electrostatic discharge protection circuit provided between the first ground wiring and the second ground wiring;

a PMOS transistor provided between the first CMOS circuit and the first power supply wiring;

an NMOS transistor provided between the first node and the first ground wiring; and an electrostatic discharge detection circuit that renders the PMOS transistor conductive and the NMOS transistor non-conductive during normal operation, and renders the PMOS transistor non-conductive and the NMOS transistor conductive when an electrostatic discharge is applied;

wherein the electrostatic discharge detection circuit includes a capacitor and a resistor that are coupled in series between the first power supply wiring and the first ground wiring, and supplies each of the gates of the PMOS transistor and the NMOS transistor with a signal from a coupling node of the capacitor and the resistor.

3. The integrated circuit device according to claim 2, wherein the first and second electrostatic discharge protection circuits become non-conductive during normal operation and become conductive when the electrostatic discharge is applied between the first power supply wiring and the first ground wiring or between the second power supply wiring and the second ground wiring, and wherein the third electrostatic discharge protection circuit becomes non-conductive when a voltage between the first ground wiring and the second ground wiring is smaller than a reference voltage, and becomes conductive when the voltage between the first ground wiring and the second ground wiring is equal to or larger than the reference voltage.

4. The integrated circuit device according to claim 2, wherein the electrostatic discharge detection circuit applies a first voltage to each of gates of the PMOS transistor and the NMOS transistor in response to the application of the electrostatic discharge, and applies a second voltage lower than the first voltage to each of the gates of the PMOS transistor and the NMOS transistor during normal operation.

5. The integrated circuit device according to claim 2, wherein the first CMOS circuit includes a CMOS inverter circuit, and the first internal circuit outputs a high-level signal or a low-level signal to the CMOS inverter circuit.

6. The integrated circuit device according to claim 2, wherein the first internal circuit outputs an analog signal to the first CMOS circuit.

7. An electrostatic discharge protection circuit comprising:

a first electrostatic discharge protection circuit provided between first power supply wiring and first ground wiring;

a second electrostatic discharge protection circuit provided between second power supply wiring and second ground wiring;

a third electrostatic discharge protection circuit provided between the first ground wiring and the second ground wiring;

a PMOS transistor coupled to the first power supply wiring and provided between a first CMOS circuit coupled to the first ground wiring and the first power supply wiring, the first CMOS circuit receiving a signal from a first internal circuit and outputting a signal to a first node;

an NMOS transistor provided between the first node and the first ground wiring; and an electrostatic discharge detection circuit that renders the PMOS transistor conductive and the NMOS transistor non-conductive during normal operation, and renders the PMOS transistor non-conductive and the NMOS transistor conductive when an electrostatic discharge is applied;

wherein the electrostatic discharge detection circuit includes a diode and a resistor that are coupled in series between the first power supply wiring and the first ground wiring, and supplies each of the gates of the PMOS transistor and the NMOS transistor with a signal which occurs at a coupling node of the diode and the resistor.

8. An integrated circuit device comprising:

first and second power supply areas;

a first circuit block coupled to first power supply wiring and first ground wiring that are provided in the first power supply area, and including a first internal circuit and a first CMOS circuit that receives a signal from the first internal circuit and outputs a signal to a first node;

a second circuit block coupled to second power supply wiring and second ground wiring that are provided in the second power supply area, and including a second internal circuit and a second CMOS circuit that receives an output signal from the first node and outputs a signal to the second internal circuit;

a first electrostatic discharge protection circuit provided between the first power supply wiring and the first ground wiring;

a second electrostatic discharge protection circuit provided between the second power supply wiring and the second ground wiring;

a third electrostatic discharge protection circuit provided between the first ground wiring and the second ground wiring;

a PMOS transistor provided between the first CMOS circuit and the first power supply wiring;

an NMOS transistor provided between the first node and the first ground wiring; and an electrostatic discharge detection circuit that renders the PMOS transistor conductive and the NMOS transistor non-conductive during normal operation, and renders the PMOS transistor non-conductive and the NMOS transistor conductive when an electrostatic discharge is applied;

wherein the electrostatic discharge detection circuit includes a diode and a resistor that are coupled in series between the first power supply wiring and the first ground wiring, and supplies each of the gates of the PMOS transistor and the NMOS transistor with a signal which occurs at a coupling node of the diode and the resistor.

* * * * *